(12) United States Patent  
Kurosaki

(10) Patent No.: US 10,371,756 B2  
(45) Date of Patent: Aug. 6, 2019

(54) DETECTION CIRCUIT AND MANAGEMENT DEVICE

(71) Applicant: Panasonic Intellectual Property Management Co., Ltd., Osaka (JP)

(72) Inventor: Yuta Kurosaki, Osaka (JP)

(73) Assignee: Panasonic Intellectual Property Management Co., Ltd., Osaka (JP)

(\*) Notice: Subject to any disclaimer, the term of this patent is extended or adjusted under 35 U.S.C. 154(b) by 31 days.

(21) Appl. No.: 15/748,833

(22) PCT Filed: Sep. 8, 2016

(86) PCT No.: PCT/JP2016/004099  
§ 371 (c)(1),  
(2) Date: Jan. 30, 2018

(87) PCT Pub. No.: WO2017/056411  
PCT Pub. Date: Apr. 6, 2017

(65) Prior Publication Data  
US 2018/0224506 A1 Aug. 9, 2018

(30) Foreign Application Priority Data  
Sep. 28, 2015 (JP) .................... 2015-190333

(51) Int. Cl.  
*G01N 27/416* (2006.01)  
*G01R 31/382* (2019.01)  
(Continued)

(52) U.S. Cl.  
CPC ........... *G01R 31/382* (2019.01); *G01R 31/02* (2013.01); *G01R 31/026* (2013.01);  
(Continued)

(58) Field of Classification Search  
CPC . H01L 2924/00014; H01L 2224/05155; H01L 2224/05171; H01L 2224/05624;  
(Continued)

(56) References Cited

U.S. PATENT DOCUMENTS

| | | | |
|---|---|---|---|
| 2014/0055169 A1* | 2/2014 | Mitsuno | H03K 5/19 327/108 |
| 2016/0160783 A1* | 6/2016 | Fujita | F02D 41/221 701/103 |
| 2017/0063075 A1* | 3/2017 | Takeuchi | H02H 3/16 |

FOREIGN PATENT DOCUMENTS

JP 2014-169883 9/2014

OTHER PUBLICATIONS

International Search Report of PCT application No. PCT/JP2016/004099 dated Nov. 29, 2016.

\* cited by examiner

*Primary Examiner* — Giovanni Astacio-Oquendo  
*Assistant Examiner* — Raul J Rios Russo  
(74) *Attorney, Agent, or Firm* — McDermott Will & Emery LLP

(57) ABSTRACT

An abnormality notification switch is switched on when a power storage module is abnormal but is switched off when the power storage module is normal. A first detection element outputs a signal indicating an abnormality of the power storage module when detecting that an electric current flows along an electric current line. A second detection element is inserted into an electric current line between a node and a second high-side reference potential that has a higher potential than a potential of a first high-side reference potential. The second detection element outputs a signal indicating an occurrence of a disconnection when detecting that no electric current flows along this electric current line. A retaining circuit retains a potential at the node higher than the first (Continued)

high-side reference potential and lower than the second high-side reference potential.

5 Claims, 4 Drawing Sheets

(51) Int. Cl.
  *G01R 31/02* (2006.01)
  *H02J 7/02* (2016.01)
  *H01M 10/42* (2006.01)
  *H01M 10/44* (2006.01)
  *H01M 10/48* (2006.01)
  *H02J 7/00* (2006.01)
  *H02J 7/06* (2006.01)
  *H01M 10/052* (2010.01)

(52) U.S. Cl.
  CPC ....... *H01M 10/052* (2013.01); *H01M 10/425* (2013.01); *H01M 10/441* (2013.01); *H01M 10/482* (2013.01); *H02J 7/0026* (2013.01); *H02J 7/0072* (2013.01); *H02J 7/02* (2013.01); *H02J 7/06* (2013.01); *H01M 2010/4271* (2013.01)

(58) Field of Classification Search
  CPC ................ G01R 31/364; G01R 31/385; G01R 31/3835; G01R 31/36
  USPC .................................................. 324/425–437
  See application file for complete search history.

DETECTION CIRCUIT AND MANAGEMENT DEVICE

This application is a U.S. national stage application of the PCT International Application No. PCT/JP2016/004099 filed on Sep. 8, 2016, which claims the benefit of foreign priority of Japanese patent application 2015-190333 filed on Sep. 28, 2015, the contents all of which are incorporated herein by reference.

TECHNICAL FIELD

The present invention relates to a detection circuit that detects an abnormality and disconnection of a power storage module and a management device for a power storage module.

BACKGROUND ART

In a power storage system, a plurality of power storage modules are connected in series to provide a high voltage or in parallel to provide a high capacity. Moreover, a management device is typically provided to manage the plurality of power storage modules (e.g., refer to PTL 1).

In some cases, the management device is connected to the power storage modules by an abnormality detection line, in order for the management device to instantly detect an occurrence of an abnormality in the plurality of power storage modules. As a conceivable configuration, for example, abnormality notification switches each of which is turned on in response to an occurrence of an abnormality in a corresponding power storage module may be provided and connected in parallel to the abnormality detection line. With this configuration, the management device can detect an occurrence of an abnormality in any of the power storage modules. More specifically, when an abnormality occurs in one of the power storage modules, the abnormality notification switch corresponding to this power storage module is turned on, and the abnormality detection line thereby conducts electricity.

CITATION LIST

Patent Literature

PTL 1: Unexamined Japanese Patent Publication No. 2014-169883

SUMMARY OF THE INVENTION

As described above, a-contact switches, each of which is opened in a normal state but closed in an abnormal state, can be used and connected in parallel. In this configuration, when an abnormality occurs in one of the power storage modules, the abnormality detection line conducts electricity. Alternatively, b-contact switches, each of which is closed in a normal state but opened in an abnormal state, can be used and connected in series. In this configuration, however, when the electric current stops flowing along the abnormality detection line, it may be difficult to immediately determine which of an abnormality occurrence notification from a power storage module and a disconnection of the abnormality detection line causes the non-flowing of the electric current.

When the a-contact switches are connected in parallel, no electric current flows along the abnormality detection line unless an abnormality occurs in the plurality of power storage modules. Therefore, if the abnormality detection line is disconnected, the management device may be basically unable to detect this disconnection. In short, if an abnormality occurs in any of the power storage modules when the abnormality detection line is disconnected, the management device may fail to detect this abnormality.

The present invention addresses the above situation with an object of providing a technique for instantly detecting a disconnection of an abnormality detection line to which a-contact switches are connected in parallel.

A detection circuit according to an aspect of the present invention includes an abnormality notification switch, a first detection element, a second detection element, and a retaining circuit. The abnormality notification switch is switched on when a power storage module is abnormal but is switched off when the power storage module is normal. The abnormality notification switch is a switch inserted into an electric current line between a first high-side reference potential and a low-side reference potential. The first detection element outputs a signal indicating an abnormality of the power storage module when detecting that an electric current flows along the electric current line between the first high-side reference potential and the abnormality notification switch. The first detection element is inserted into the electric current line between the first high-side reference potential and the abnormality notification switch. The second detection element outputs a signal indicating an occurrence of a disconnection of the electric current line between a second high-side reference potential and the low-side reference potential when detecting that no electric current flows along an electric current line between the second high-side reference potential and a node at which the first detection element is connected to the abnormality notification switch. The second high-side reference potential has a higher potential than a potential of the first high-side reference potential. The second detection element is inserted into the electric current line between the second high-side reference potential and the node. The retaining circuit retains a potential at the node higher than the first high-side reference potential but lower than the second high-side reference potential.

A detection circuit according to another aspect of the present invention is a management device. This device is a management device that manages a power storage module having an abnormality notification switch. The abnormality notification switch is a switch that is inserted into an electric current line between a first high-side reference potential and a low-side reference potential and that is switched on when the power storage module is abnormal but is switched off when the power storage module is normal. The management device includes a first detection element and a second detection element. The first detection element outputs a signal indicating an abnormality of the power storage module when detecting that an electric current flows along the electric current line between the first high-side reference potential and the abnormality notification switch. The first detection element is inserted into the electric current line between the first high-side reference potential and the abnormality notification switch. The second detection element outputs a signal indicating an occurrence of a disconnection of the electric current line between a second high-side reference potential and the low-side reference potential when detecting that no electric current flows along an electric current line between the second high-side reference potential and a node at which the first detection element is connected to the abnormality notification switch. The second high-side reference potential has a higher potential than a potential of the first high-side reference potential. The second detection element is inserted into the electric current line between the second high-side reference potential and the node. A potential at the node is retained higher than the first high-side reference potential but lower than the second high-side reference potential.

Any desired combinations of the above-described components and converted expressions of the present invention in methods, devices, systems, and other similar entities are still effective as aspects of the present invention.

According to the present invention, it is possible to instantly detect a disconnection of an abnormality detection line to which a-contact switches are connected in parallel.

DESCRIPTION OF EMBODIMENT

Figure 1:
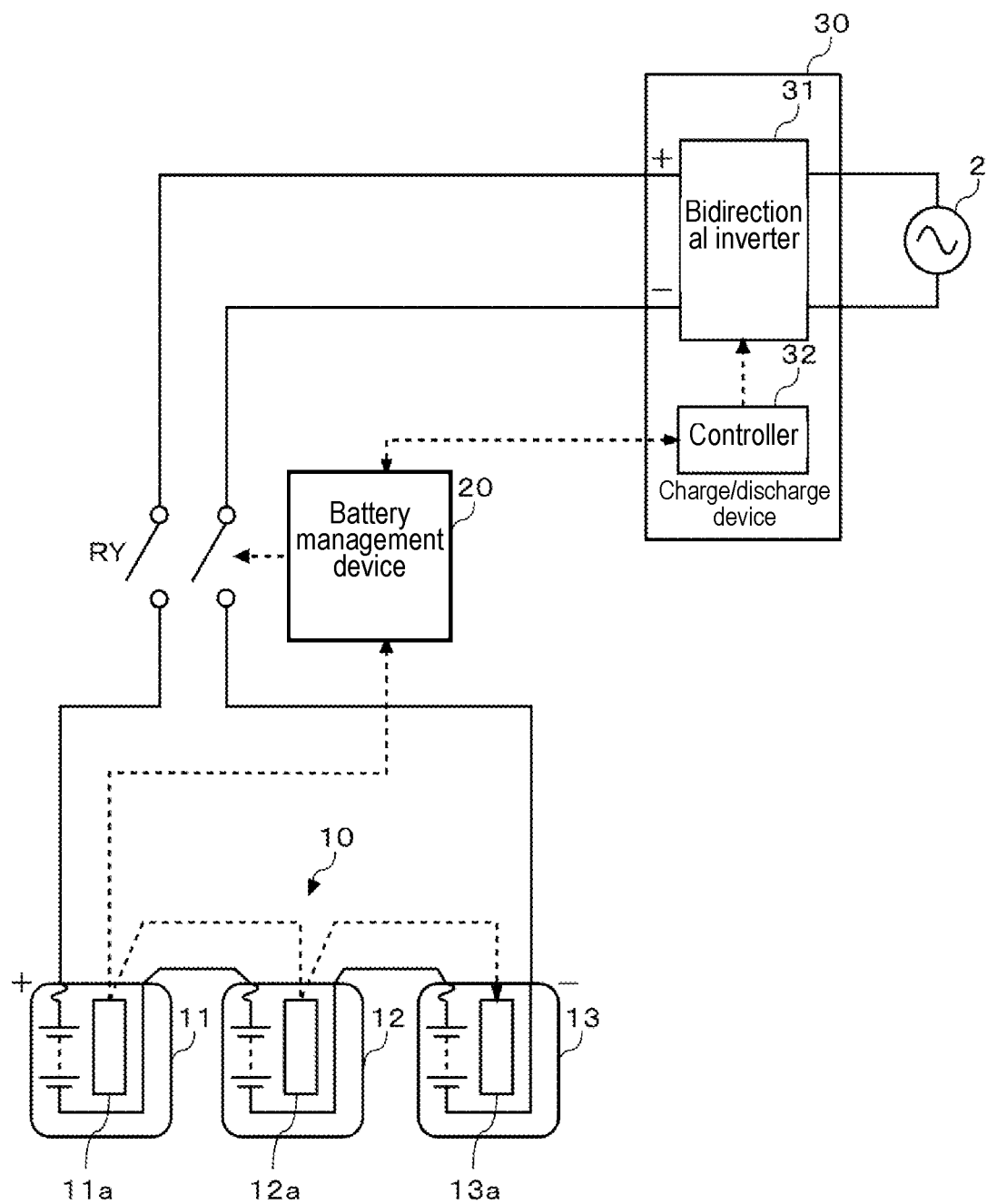
FIG. 1 is a view of an overall configuration of a power storage system that employs an abnormality detection circuit according to an exemplary embodiment of the present invention.

FIG. 1 is a view of an overall configuration of power storage system 1 that employs an abnormality detection circuit according to an exemplary embodiment of the present invention. Power storage system 1 includes power storage unit 10, battery management device 20, and charge/discharge device 30. Charge/discharge device 30 includes bidirectional inverter 31 and controller 32. Power storage unit 10 is formed by connecting a plurality of power storage modules. Referring to FIG. 1, first power storage module 11, second power storage module 12, and third power storage module 13 are connected in series to form power storage unit 10. The number of the power storage modules connected in series is not limited to three. Alternatively, the power storage modules may be connected in parallel, or the power storage modules may be connected in multi-serial and multi-parallel connection.

Each storage module includes: a plurality of battery cells connected in series; and a monitoring unit that monitors a state of the battery cells. Referring to FIG. 1, first power storage module 11 is provided with first monitoring unit 11a; second power storage module 12 is provided with second monitoring unit 12a; and third power storage module 13 is provided with third monitoring unit 13a.

Herein, lithium ion batteries are expected to be used as the battery cells. Each of the monitoring units includes an unillustrated electric current sensor, voltage sensor, and temperature sensor, and monitors an electric current, a voltage, and a temperature of corresponding battery cells. Each monitoring unit transmits monitoring data to battery management device 20 in response to a data acquisition request from battery management device 20. It should be noted that the plurality of battery cells in each power storage module does not necessarily have to be connected in series. Alternatively, the battery cells may be connected in parallel, or the battery cells may be connected in multi-serial and multi-parallel connection.

Charge/discharge device 30 is a device that charges the power storage unit 10 with electricity from the outside or causes the power storage unit 10 to discharge the electricity to the outside. Upon the charging, bidirectional inverter 31 in charge/discharge device 30 coverts alternating current (AC) power supplied from power supply system 2 into direct current (DC) power and then supplies the DC power to power storage unit 10, under the control of controller 32.

For example, controller 32 may control bidirectional inverter 31 in the following manner. Bidirectional inverter 31 charges power storage unit 10 with a constant electric current (CC charging) until a voltage of power storage unit 10 reaches a preset voltage. After the voltage of power storage unit 10 has reached the preset voltage, bidirectional inverter 31 charges power storage unit 10 with a constant voltage (CV charging). In other words, in order to regulate the output electric current or output voltage of bidirectional inverter 31, controller 32 may adjust a duty ratio of a switching element, such as an insulated gate bipolar transistor (IGBT), in bidirectional inverter 31.

Upon the discharging, bidirectional inverter 31 converts DC power supplied from power storage unit 10 into AC power and then returns the AC power to power supply system 2, under the control of controller 32. Alternatively, bidirectional inverter 31 may supply the AC power to an unillustrated AC load.

Battery management device 20 is a device that manages and protects power storage unit 10. Battery management device 20 is connected to first to third monitoring units 11a to 13a in first to third power storage modules 11 to 13, respectively, and to controller 32 in charge/discharge device 30 by communication lines. Each of these communication lines may be a RS-485 cable, a RS-422 cable, or an optical fiber, for example.

Into a power line between power storage unit 10 and charge/discharge device 30 are relays RY inserted. When an abnormality such as an overvoltage or an overcurrent occurs, battery management device 20 opens relays RY, protecting power storage unit 10. When an abnormality occurs in any of the power storage modules, battery management device 20 needs to open relays RY as immediately as possible. However, when each of monitoring units 11a to 13a transmits an abnormality detection signal to battery management device 20 by using the communication line, communication processes in which each of monitoring units 11a to 13a transmits the abnormality detection signal and in which battery management device 20 receives the abnormality detection signals are involved. As a result, a little time lag may arise between when each of monitoring units 11a to 13a detects an abnormality of the cells and when the battery management device 20 opens relays RY.

For the purpose of shortening the time lag, which may arise between when each of monitoring units 11a to 13a detects an abnormality of the cells and when the battery management device 20 opens relays RY, an abnormality detection circuit according to this exemplary embodiment is introduced.

Figure 2:
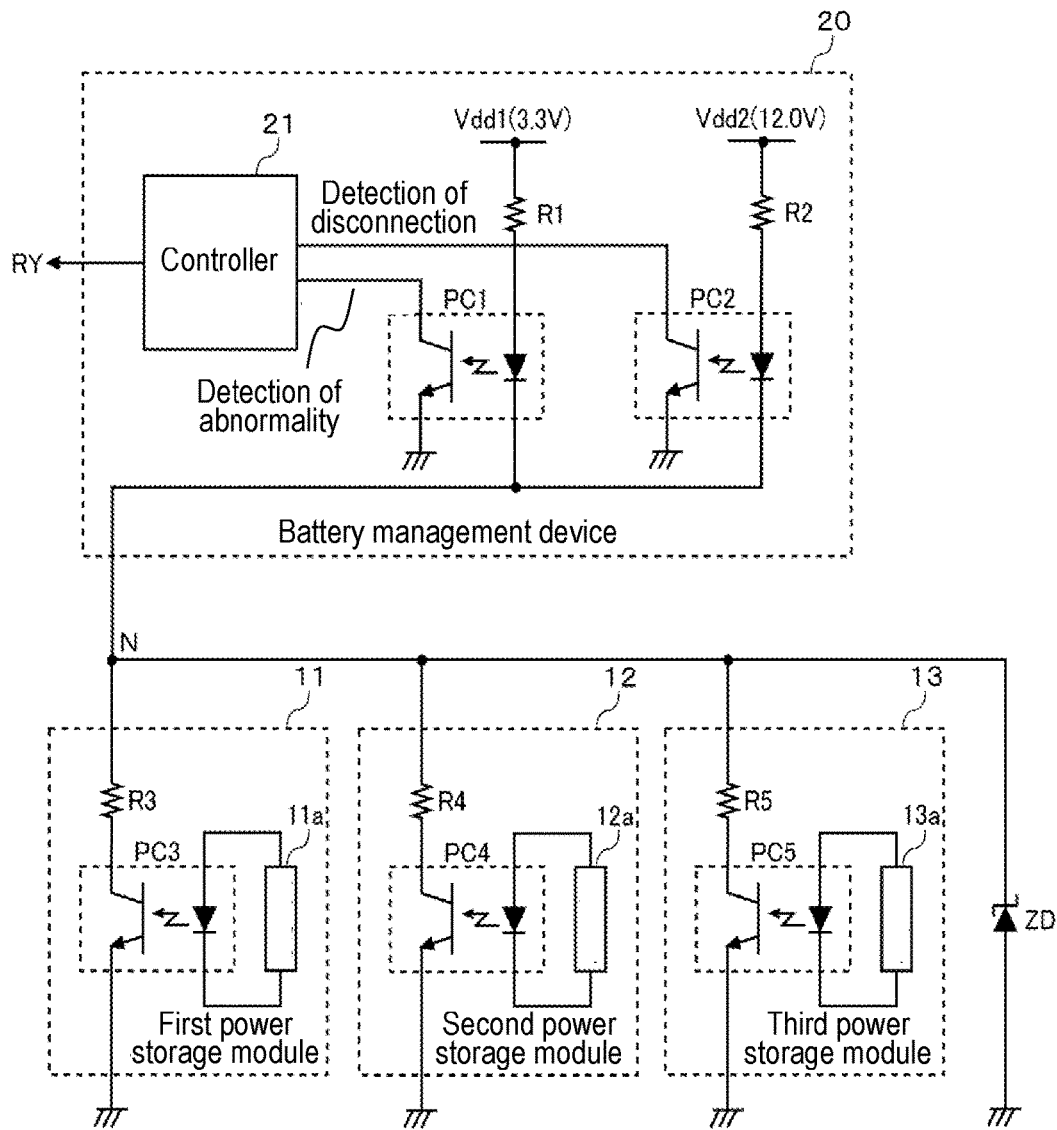
FIG. 2 is a view of a configuration of the abnormality detection circuit according to this exemplary embodiment.

FIG. 2 is a view of a configuration of the abnormality detection circuit according to this exemplary embodiment. This abnormality detection circuit includes first photocoupler PC1 to fifth photocoupler PC5, first resistor R1 to fifth resistor R5, and zener diode ZD.

Third resistor R3 and third photocoupler PC3 are provided inside first power storage module 11. Third photocoupler PC3 has a light emitting diode (LED) connected to first monitoring unit 11a. When detecting an abnormality in the cells inside first power storage module 11, first monitoring unit 11a feeds an electric current to the LED. As a result, the LED emits light.

A phototransistor in third photocoupler PC3 is inserted into an electric current line for abnormality detection, which is connected to both first power supply potential Vdd1 and second power supply potential Vdd2 in battery management device 20. A collector terminal of this phototransistor is connected, through third resistor R3, to a node N, which is a midway point on the electric current line. An emitter terminal of the phototransistor is connected to a ground potential. The phototransistor is turned on when receiving the light from the LED but is kept in an off state unless receiving the light.

Fourth resistor R4 and fourth photocoupler PC4 are provided inside second power storage module 12. Fifth resistor R5 and fifth photocoupler PC5 are provided inside third power storage module 13. The connections of these elements will not be described, because the connections of the elements are similar to the connections of third resistor R3 and third photocoupler PC3 in first power storage module 11.

First resistor R1, first photocoupler PC1, second resistor R2, and second photocoupler PC2 are provided inside battery management device 20. An LED in first photocoupler PC1 is inserted into the electric current line for abnormality detection in a forward direction. More specifically, an anode terminal of this LED is connected to first power supply potential Vdd1 through first resistor R1, whereas a cathode terminal of the LED is connected to node N. A collector terminal of a phototransistor in first photocoupler PC1 is connected to controller 21 in battery management device 20, whereas an emitter terminal of this phototransistor is connected to the ground potential.

An LED in second photocoupler PC2 is inserted into the electric current line for abnormality detection in the forward direction. More specifically, an anode terminal of this LED is connected to second power supply potential Vdd2 through second resistor R2, whereas a cathode terminal of the LED is connected to node N. A collector terminal of a phototransistor in second photocoupler PC2 is connected to controller 21 in battery management device 20, whereas an emitter terminal of this phototransistor is connected to the ground potential.

Second power supply potential Vdd2 is set to be higher than first power supply potential Vdd1. As an example, the potential of first power supply potential Vdd1 may be set in a range from 3.0 V to 5.0 V both inclusive, such as 3.3 V, whereas the potential of second power supply potential Vdd2 may be set to 12.0 V. A reference potential in battery management device 20 may be used for second power supply potential Vdd2. This reference potential may be generated by an unillustrated AC/DC converter that lowers the voltage of power supply system 2 or by an unillustrated DC/DC converter that lowers the voltage of power storage unit 10. First power supply potential Vdd1 may be generated by a step-down circuit, such as a three-terminal regulator, further lowering the voltage of the AC/DC converter or the DC/DC converter.

Zener diode ZD retains the potential at node N higher than first power supply potential Vdd1 but lower than the potential of second power supply potential Vdd2. As an example, the potential at node N may be kept in a range from 6.0 V to 8.0 V both inclusive, such as 6.8 V. More specifically, zener diode ZD is inserted between node N and the ground potential in a direction in which a zener electric current flows from node N to the ground potential. For example, zener diode ZD may be mounted in a power storage module positioned at a downstream end. In the configuration illustrated in FIG. 2, only zener diode ZD is inserted between node N and the ground potential; however, in addition to zener diode ZD, a resistor may be inserted. When the resistor is inserted in this manner, this resistor may be used as a shunt resistor, in which case it is possible to detect a conductive state of zener diode ZD based on a voltage drop across the resistor.

In the circuit configuration described above, when first monitoring unit 11a detects an abnormality of the battery cells, the phototransistor of third photocoupler PC3 is turned on. As a result, electric conduction is made between first power supply potential Vdd1 and the ground potential, and an electric current thereby flows through the LED of first photocoupler PC1, causing the LED to emit the light. In turn, the light emitted by the LED turns on the phototransistor of first photocoupler PC1, setting a potential at an abnormality detection signal input terminal of controller 21 to a low level. A similar operation may be performed when second monitoring unit 12a or third monitoring unit 13a detects an abnormality of the battery cells.

When the potential at the abnormality detection signal input terminal is set to the low level, controller 21 determines that an abnormality occurs in any of the power storage modules, thereby opening relays RY. The occurrence of an abnormality in the battery cells can be an urgent incident; therefore the configuration preferably opens relays RY instantly. For example, the configuration may employ a configuration that does not involve any software process, such as a configuration in which the abnormality detection signal is directly supplied to a driver circuit for relays RY.

An electric current continues to flow through the LED of second photocoupler PC2 unless a disconnection occurs, because the potential at node N is kept lower than the potential of second power supply potential Vdd2. Thus, the phototransistor of second photocoupler PC2 is normally in an on state, and a potential at a disconnection detection signal input terminal of controller 21 is normally at the low level.

When a disconnection occurs at any point in the electric current line extending from second power supply potential Vdd2 to the ground potential through the LED of second photocoupler PC2 and zener diode ZD, the electric current stops flowing through the LED of second photocoupler PC2. In response, the phototransistor of second photocoupler PC2 is turned off, raising the potential at disconnection detection signal input terminal of controller 21.

In a state where the potential at the abnormality detection signal input terminal does not indicate a detection of an abnormality, when the potential at the disconnection detection signal input terminal rises, controller 21 determines that a disconnection occurs. The disconnection of the electric current line for abnormality detection can be less urgent than an abnormality of the battery cells. Thus, the abnormality detection signal may be supplied to a central processing unit (CPU), which then may perform a software process. For example, the CPU may report a disconnection detection signal to controller 32 in charge/discharge device 30, thereby directing controller 32 to stop an operation of bidirectional inverter 31.

In the circuit configuration described above, other switching elements may be used instead of third photocoupler PC3 to fifth photocoupler PC5. Any type of switching elements that conduct electricity when first monitoring unit 11a to third monitoring unit 13a detect abnormalities may be used. For example, semiconductor switches, such as metal oxide semiconductor field-effect transistors (MOSFETs) or IGBTs, or mechanical switches, such as relays, may be used.

In the circuit configuration described above, other electric current detection elements may be used instead of first photocoupler PC1 and second photocoupler PC2. Any elements that detect whether electric currents flow through corresponding electric current lines and report the detection results to controller 21 may be used. For example, a shunt resistor and a rectifying element may be inserted into the electric current line instead of first photocoupler PC1, and a differential amplifier may detect a voltage across the shunt resistor. Instead of the shunt resistor inserted into the electric current line, an electric current detection element using magnetism, such as a Hall element, may be used. This alternative configuration is also applicable to second photocoupler PC2.

In the circuit configuration described above, instead of zener diode ZD, another voltage retaining circuit that retains the potential at node N higher than first power supply potential Vdd1 but lower than the potential of second power supply potential Vdd2 may be used. For example, resistors that form a voltage divider may be used to lower the potential at node N to higher than first power supply potential Vdd1 but lower than the potential of second power supply potential Vdd2.

Figure 3:
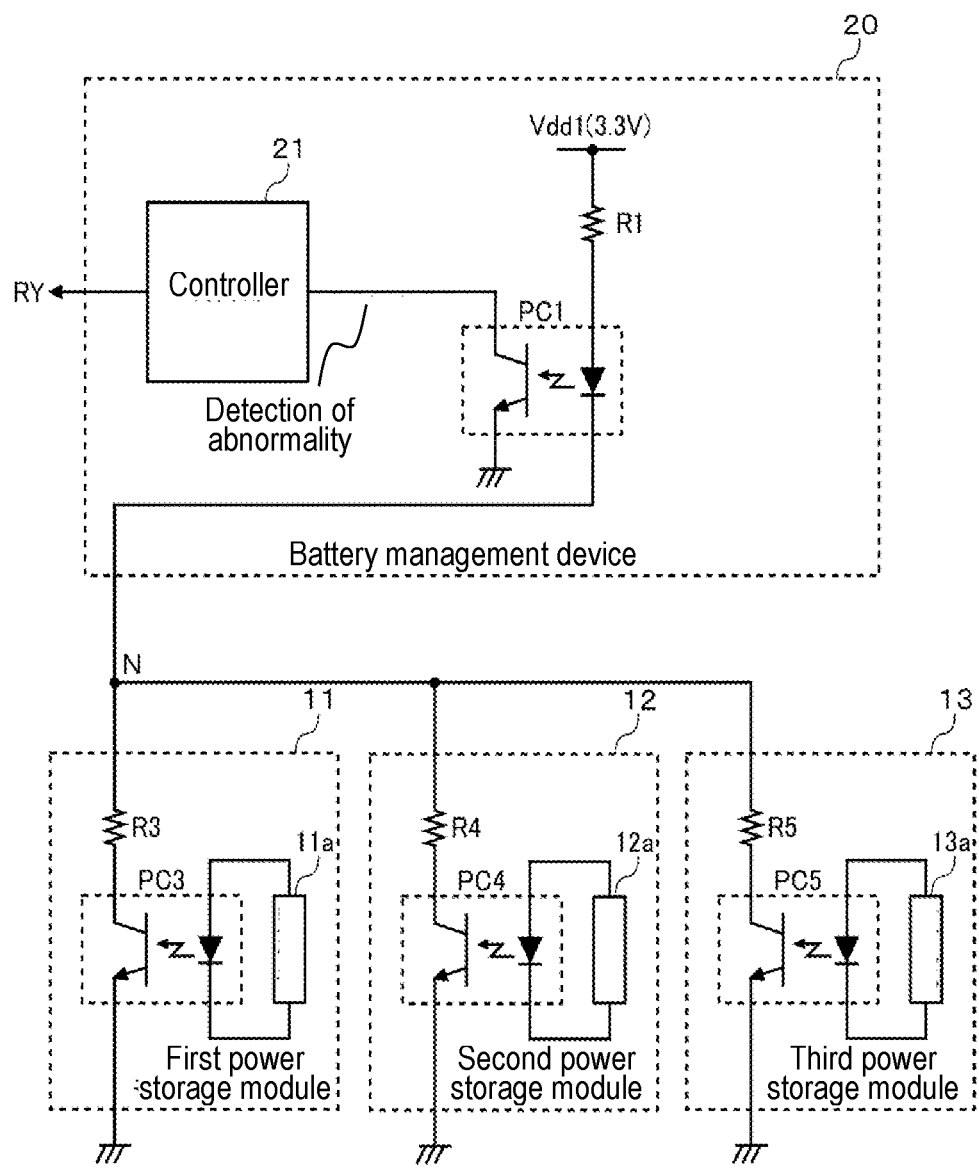
FIG. 3 is a view of a configuration of another abnormality detection circuit to be compared with the abnormality detection circuit of FIG. 2.

FIG. 3 is a view of a configuration of an abnormality detection circuit to be compared with the abnormality detection circuit of FIG. 2. The configuration of the abnormality detection circuit according to a comparative example of FIG. 3 is equivalent to the configuration of the abnormality detection circuit according to the exemplary embodiment of FIG. 2 from which zener diode ZD, second photocoupler PC2, and second resistor R2 are removed. In this configuration, when an electric current line for abnormality detection is disconnected between battery management device 20 and power storage unit 10, controller 21 may fail to recognize this disconnection. As a result, power storage unit 10 continues to operate while the electric current line is disconnected. Thus, even when first monitoring unit 11a to third monitoring unit 13a detect abnormalities of the battery cells and thus third photocoupler PC3 to fifth photocoupler PC5 are turned on, controller 21 may fail to recognize an abnormality based on a level of the electric current line.

According to this exemplary embodiment described above, adding zener diode ZD and second photocoupler PC2 makes it possible to instantly detect a disconnection of an electric current line for abnormality detection, to which third photocoupler PC3 to fifth photocoupler PC5 each formed of an a-contact switch are connected in parallel.

A detection of a disconnection of the electric current line for abnormality detection may be implemented by a software control in which third photocoupler PC3 to fifth photocoupler PC5 are turned on at regular intervals. However, a detection of a disconnection implemented by hardware control as described above is more advantageous in terms of reliability and responsiveness. Furthermore, when the abnormality detection signal is directly supplied to the driver circuit for relays RY, the software control that responds to the turn-on of third photocoupler PC3 to fifth photocoupler PC5 cannot be used.

The present invention is described based on the exemplary embodiment. The person of the ordinary skill in the art can understand that the exemplary embodiment is illustrative, combinations of these constitution elements and combined processes can be modified, and such modified examples fall within the scope of the present invention.

Figure 4:
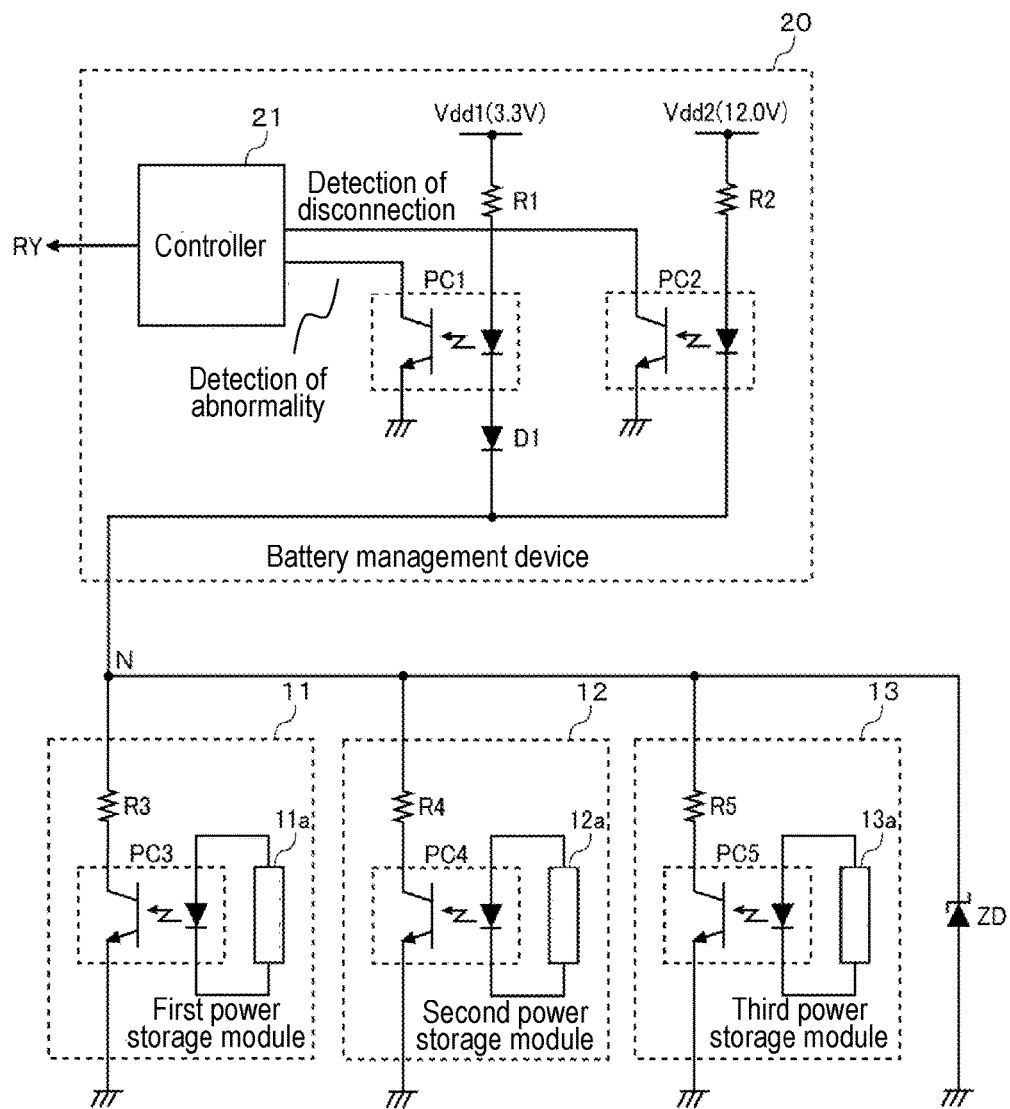
FIG. 4 is a view of a configuration of an abnormality detection circuit according to a modified example of the exemplary embodiment of FIG. 2.

FIG. 4 is a view of a configuration of an abnormality detection circuit according to a modified example. The configuration of the abnormality detection circuit according to the modified example of FIG. 4 is equivalent to the configuration of the abnormality detection circuit according to the exemplary embodiment of FIG. 2 to which diode D1 is added.

An LED of first photocoupler PC1 serves as an element that not only detects a conduction/nonconduction of an electric current line connected to first power supply potential Vdd1 but also fulfills a rectifying function to prevent an electric current from flowing reversely from node N to first power supply potential Vdd1. However, a rated reverse voltage of the LED may be insufficient. In this modified example, by adding diode D1, in the forward direction, to the electric current line connected to first power supply potential Vdd1, the rated reverse voltage is increased. According to the modified example described above, it is possible to more reliably prevent the electric current from flowing reversely from node N to first power supply potential Vdd1.

In the exemplary embodiment described above, lithium ion batteries are expected to be used as the cells in each power storage module; however, another type of batteries, such as nickel hydride batteries or lead-acid batteries, may be used. Alternatively, instead of such batteries, capacitors, such as electric double-layer capacitors, may be used.

The exemplary embodiment may be specified by items described below.

[Item 1]

A detection circuit including: abnormality notification switch (PC3) that is switched on when power storage module (11) is abnormal but is switched off when power storage module (11) is normal, abnormality notification switch (PC3) being a switch inserted into an electric current line between first high-side reference potential (Vdd1) and low-side reference potential (GND);

first detection element (PC1) that outputs a signal indicating an abnormality of power storage module (11) when detecting that an electric current flows along the electric current line between first high-side reference potential (Vdd1) and abnormality notification switch (PC3), first detection element (PC1) being inserted into the electric current line between first high-side reference potential (Vdd1) and abnormality notification switch (PC3);

second detection element (PC2) that outputs a signal indicating an occurrence of a disconnection of the electric current line between second high-side reference potential (Vdd2) and low-side reference potential (GND) when detecting that no electric current flows along the electric current line between second high-side reference potential (Vdd2) and node (N) at which first detection element (PC1) is connected to abnormality notification switch (PC3), second high-side reference potential (Vdd2) having a higher potential than a potential of first high-side reference potential (Vdd1), second detection element (PC2) being inserted into the electric current line between second high-side reference potential (Vdd2) and node (N); and retaining circuit (ZD) that retains a potential at node (N) higher than first high-side reference potential (Vdd1) but lower than second high-side reference potential (Vdd2).

This configuration makes it possible to detect a disconnection of an electric current line with hardware.

[Item 2]

The detection circuit according to item 1, in which a plurality of the power storage modules are provided, a plurality of abnormality notification switches (PC3 to PC5) are provided for respective power storage modules (11 to 13), and the plurality of abnormality notification switches (PC3 to PC5) are connected in parallel between node (N) and low-side reference potential (GND).

This configuration makes it possible to detect, with hardware, both an occurrence of an abnormality in any of the plurality of power storage modules (11 to 13) and a disconnection of the electric current line.

[Item 3]

The detection circuit according to item 1 or 2, in which retaining circuit (ZD) is zener diode (ZD) inserted between node (N) and low-side reference potential (GND) in a direction in which a zener electric current flows from node (N) to low-side reference potential (GND).

This configuration makes it possible to clamp the potential at node (N) with high accuracy.

[Item 4]

The detection circuit according to any one of items 1 and 3, in which first detection element (PC1) is first photocoupler (PC1), first photocoupler (PC1) including a first light emitting diode and a first phototransistor, the first light emitting diode being inserted, in a forward direction, into the electric current line between first high-side reference potential (Vdd1) and node (N), the first phototransistor being controlled by light from the first light emitting diode, and second detection element (PC2) is second photocoupler (PC2), second photocoupler (PC2) including a second light emitting diode and a second phototransistor, the second light emitting diode being inserted, in a forward direction, into the electric current line between second high-side reference potential (Vdd2) and node (N), the second phototransistor being controlled by light from the second light emitting diode.

This configuration makes it possible to achieve, with a single element, both a function of detecting a conductive state of the electric current line and a rectifying function.

[Item 5]

Management device (20) that manages power storage module (11), power storage module (11) having abnormality notification switch (PC3), abnormality notification switch (PC3) being a switch that is inserted into an electric current line between first high-side reference potential (Vdd1) and low-side reference potential (GND) and that is switched on when power storage module (11) is abnormal but is switched off when power storage module (II) is normal, management device (20) including:

first detection element (PC1) that outputs a signal indicating an abnormality of power storage module (11) when detecting that an electric current flows along the electric current line between first high-side reference potential (Vdd1) and abnormality notification switch (PC3), first detection element (PC1) being inserted into the electric current line between first high-side reference potential (Vdd1) and abnormality notification switch (PC3); and second detection element (PC2) that outputs a signal indicating an occurrence of a disconnection of the electric current line between second high-side reference potential (Vdd2) and low-side reference potential (GND) when detecting that no electric current flows along the electric current line between second high-side reference potential (Vdd2) and node (N) at which first detection element (PC1) is connected to abnormality notification switch (PC3), second high-side reference potential (Vdd2) having a higher potential than a potential of first high-side reference potential (Vdd1), second detection element (PC2) being inserted into the electric current line between second high-side reference potential (Vdd2) and node (N).

A potential at node (N) is retained higher than first high-side reference potential (Vdd1) but lower than second high-side reference potential (Vdd2).

This configuration makes it possible to detect a disconnection of an electric current line with hardware.

The invention claimed is:

1. A detection circuit comprising:
   an abnormality notification switch that is switched on when a power storage module is abnormal but is switched off when the power storage module is normal, the abnormality notification switch being a switch inserted into an electric current line between a first high-side reference potential and a low-side reference potential;
   a first detection element that outputs a signal indicating an abnormality of the power storage module when detecting that an electric current flows along the electric current line between the first high-side reference potential and the abnormality notification switch, the first detection element being inserted into the electric current line between the first high-side reference potential and the abnormality notification switch;
   a second detection element that outputs a signal indicating an occurrence of a disconnection of the electric current line between a second high-side reference potential and the low-side reference potential when detecting that no electric current flows along an electric current line between the second high-side reference potential and a node at which the first detection element is connected to the abnormality notification switch, the second high-side reference potential having a higher potential than a potential of the first high-side reference potential, the second detection element being inserted into the electric current line between the second high-side reference potential and the node; and
   a retaining circuit that retains a potential at the node higher than the first high-side reference potential but lower than the second high-side reference potential.

2. The detection circuit according to claim 1, wherein
   a plurality of the power storage modules are provided,
   a plurality of the abnormality notification switches are provided for the respective power storage modules, and
   the plurality of abnormality notification switches are connected in parallel between the node and the low-side reference potential.

3. The detection circuit according to claim 1, wherein the retaining circuit is a zener diode inserted between the node and the low-side reference potential in a direction in which a zener electric current flows from the node to the low-side reference potential.

4. The detection circuit according to claim 1, wherein
   the first detection element is a first photocoupler,
   the first photocoupler including a first light emitting diode and a first phototransistor, the first light emitting diode being inserted, in a forward direction, into the electric current line between the first high-side reference potential and the node, the first phototransistor being controlled by light from the first light emitting diode, and
   the second detection element is a second photocoupler,
   the second photocoupler including a second light emitting diode and a second phototransistor, the second light emitting diode being inserted, in a forward direction, into the electric current line between the second high-side reference potential and the node, the second phototransistor being controlled by light from the second light emitting diode.

5. A management device that manages a power storage module, the power storage module having an abnormality notification switch, the abnormality notification switch being a switch that is inserted into an electric current line between a first high-side reference potential and a low-side reference potential and that is switched on when the power storage module is abnormal but is switched off when the power storage module is normal, the management device comprising:

a first detection element that outputs a signal indicating an abnormality of the power storage module when detecting that an electric current flows along the electric current line between the first high-side reference potential and the abnormality notification switch, the first detection element being inserted into the electric current line between the first high-side reference potential and the abnormality notification switch; and a second detection element that outputs a signal indicating an occurrence of a disconnection of the electric current line between a second high-side reference potential and the low-side reference potential when detecting that no electric current flows along an electric current line between the second high-side reference potential and a node at which the first detection element is connected to the abnormality notification switch, the second high-side reference potential having a higher potential than a potential of the first high-side reference potential, the second detection element being inserted into the electric current line between the second high-side reference potential and the node, wherein a potential at the node is retained higher than the first high-side reference potential but lower than the second high-side reference potential.

* * * * *